United States Patent
Ikake

(10) Patent No.: US 6,337,569 B1
(45) Date of Patent: Jan. 8, 2002

(54) APPARATUS FOR DETECTING EARTHED SIDE OF AC POWER SUPPLY

(75) Inventor: Katsunori Ikake, Higashi-Osaka (JP)

(73) Assignee: HMI Co., Ltd., Osaka (JP)

(*) Notice: Subject to any disclaimer, the term of this patent is extended or adjusted under 35 U.S.C. 154(b) by 0 days.

(21) Appl. No.: 09/556,402

(22) Filed: Apr. 24, 2000

(30) Foreign Application Priority Data

Sep. 24, 1999 (JP) .......................................... 11-271109

(51) Int. Cl.$^7$ ............................................... G01R 31/02
(52) U.S. Cl. ......................... 324/508; 324/66; 340/656
(58) Field of Search ......................... 324/508–511, 66, 324/67, 133; 340/654, 656; 439/488–490

(56) References Cited

U.S. PATENT DOCUMENTS 3,908,286 A * 9/1975 Dean et al. ............. 324/508 X
4,929,887 A * 5/1990 Robitaille et al. ...... 324/508 X
5,065,104 A * 11/1991 Kusko et al. ............... 324/508

* cited by examiner

*Primary Examiner*—Gerard R. Strecker
(74) *Attorney, Agent, or Firm*—Oblon, Spivak, McClelland, Maier & Neustadt, P.C.

(57) ABSTRACT

A power supply line on the earthed side of an AC power supply is detected in order to prevent the leakage of an electromagnetic wave. A detection apparatus detects the AC line on the earthed side of the AC power supply. A power supply terminal is provided to be connected to the AC power supply. Ground terminals are provided to be connected to ground of an electric equipment. A switching unit selectively connects either of AC lines connected with the AC power supply to ground of the detection apparatus, the selective connection being changed-over. An antenna unit detects an electromagnetic wave leaking out of the electric or electronic equipment. And, a discrimination unit discriminates an earthed side and a non-earthed side of the AC lines on the basis of a level of the electromagnetic wave and based on which of the AC lines is connected to the ground of the detection apparatus.

20 Claims, 8 Drawing Sheets

APPARATUS FOR DETECTING EARTHED SIDE OF AC POWER SUPPLY

BACKGROUND OF THE INVENTION

1. Field of the Invention

The present invention relates to an apparatus for detecting the earthed side of an AC power supply.

2. Description of the Prior Art

In Japan and certain other countries and regions, the single-phase two-wire system is adopted for the power supplies of general households and those of general office buildings. Electric equipment utilizing the power supplies are used without having their housings and grounds earthed, except in special cases.

Meanwhile, particularly personal computers are often produced in foreign countries and regions and then imported to Japan. Such products are manufactured premising the single-phase three-wire system, and are furnished as a standard with power supply plugs each having three pins (hereinbelow, also termed "3P").

In Japan etc., however, a plug socket for the power supply specification of the single-phase two-wire system is for a plug of two pins ("2P"), and the equipment is used inevitably by attaching a conversion adaptor for the 2P plug, to the 3P plug in order to feed a supply voltage to the equipment. Accordingly, a ground line originally laid in the equipment is in a floating state.

In this manner, the ground line has heretofore been in the floating state, and it has therefore been impossible to prevent unfavorable electromagnetic waves from leaking out.

Besides, although either of the lines of the AC power supply is earthed, general users cannot know which of the terminals of the plug socket is the terminal of the earthed side.

SUMMARY OF THE INVENTION

The present invention has been made in view of the problems stated above, and it has for its object to provide a detection apparatus for detecting the earth-side power supply line of an AC power supply so that an electric equipment can be readily earthed by connecting the ground thereof to the earth-side terminal of the power supply.

In order to solve the problems stated above, the present invention has taken technical measures to be explained below.

The present invention features a detection apparatus for detecting a line on an earthed side of an AC power supply, comprising power supply terminal means which can be connected to the AC power supply; ground terminals which can be connected to ground of an electric equipment (including an electronic equipment); a switching unit which selectively connects either of AC lines connected with the AC power supply, to ground of the detection apparatus, the selective connection being changed-over; an antenna unit which detects an electromagnetic wave; and a discrimination unit which discriminates an earthed side and a non-earthed side of the AC lines on the basis of a discrepancy of levels of the electromagnetic wave as depend upon which of the AC lines is connected to the ground of the detection apparatus.

Besides, the discrimination unit should preferably be fed with a signal in which the electromagnetic wave signal detected by the antenna unit is superposed on a main signal that is not affected by noise from th e AC power supply.

Here, mentioned as the signal which is not affected by the noise from the AC power supply is, for example, a signal which is generated by a power supply (for example, dry cell) separate from the AC power supply, or a signal which is generated using a voltage charged in a capacitor.

In addition, the detection apparatus should preferably include, at least, the decision unit inside a housing; the housing being provided with a switch which is relevant to the operation of the detection apparatus; the antenna unit being arranged in the vicinity of the switch. In this case, the electromagnetic wave can be detected with ease.

More concretely, the antenna unit should preferably be disposed inside the housing and behind the switch.

Besides, it is preferable that the switch is mounted on a circuit board disposed inside the housing, so as to be manipulatable from outside the housing, and that the antenna unit is formed on the circuit board.

Although the switch may be any switch relevant to the operation of the detection apparatus, it should preferably be a detection starting switch which commands the discrimination unit to start the detection.

Further, the main signal should preferably be generated by manipulation of the detection starting switch.

Besides, the power supply terminal means should preferably be a plug of two pins as can be inserted into a plug socket. Also, the detection apparatus should preferably comprise a housing including a plug socket unit into which a power supply plug of the electric or electronic equipment can be inserted.

Further, it is preferable that the housing is attached to a building or a house, and that the power supply terminal means is connected to AC-power-supply wiring lines laid in the building or the house.

A more complete appreciation of the present invention and many of the attendant advantages thereof will be readily obtained as the same becomes better understood by reference to the following detailed description when considered in connection with the accompanying drawings, wherein:

PREFERRED EMBODIMENTS OF THE INVENTION

Figure 1:
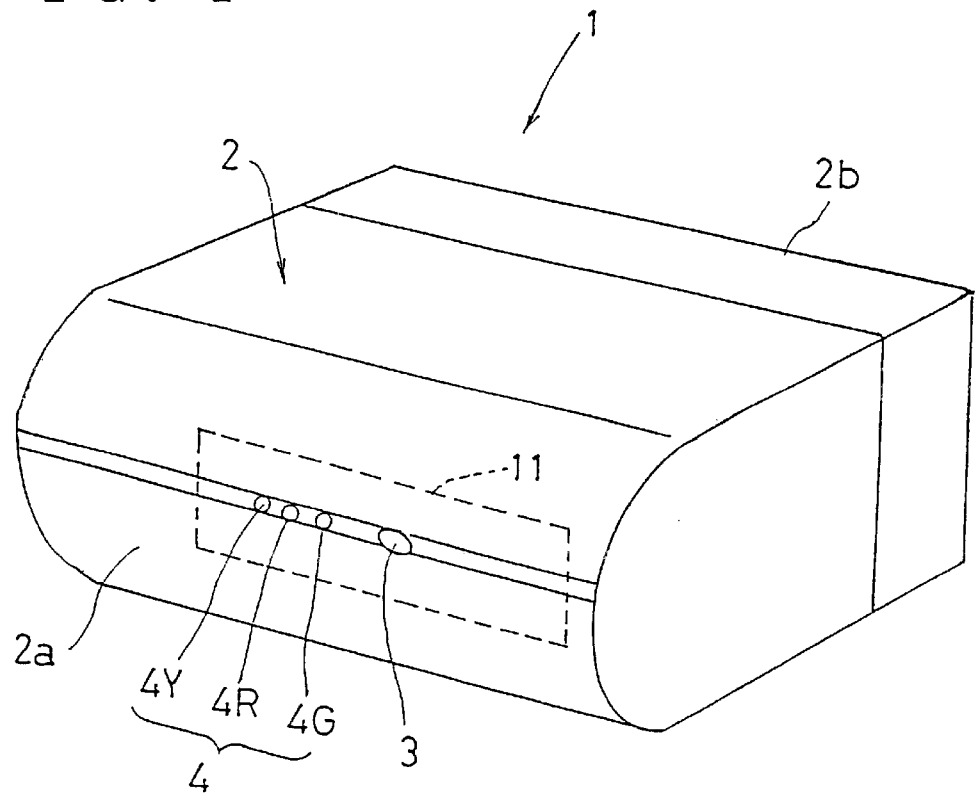
FIG. 1 is a perspective view of a detection apparatus according to the present invention for detecting the earthed side of an AC power supply.

Now, the embodiments of the present invention will be described with reference to the drawings. FIG. 1 shows the exterior view of a detection apparatus 1 for detecting the earthed side of an AC power supply. The detection apparatus 1 is chiefly constructed with its circuits arranged inside a housing 2.

A detection starting switch 3 which is a switch relevant to the operation of the detection apparatus 1, and a detected-result display unit 4 are disposed on the front side 2a of the housing 2. The detected-result display unit 4 is configured of three light-emitting diodes in different colors (green LED 4G, red LED 4R, and yellow LED 4Y).

Figure 2:
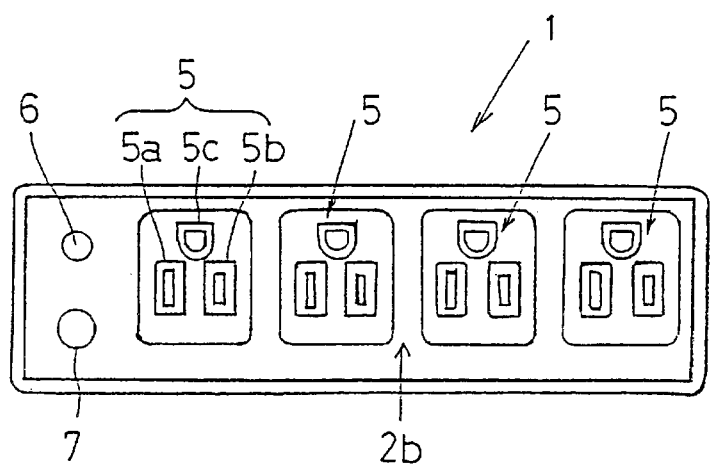
FIG. 2 is a rear view of the detection apparatus.

Besides, as shown in FIG. 2, four plug-socket units 5, 5, 5, 5 each having three pins ("3P") are disposed on the back side 2b of the housing 2. The plug socket unit 5 is one into which a power supply plug with three pins including a ground pin (power supply plug of an electric or electronic equipment such as personal computer) can be inserted. This plug socket unit 5 includes two AC terminals 5a, 5b into which the AC pins of the 3P plug are respectively inserted, and a ground terminal 5c into which the ground pin of the 3P plug is inserted.

In addition, the detection apparatus 1 includes an auxiliary ground terminal 6 on the back side 2b of the housing 2. The auxiliary ground terminal 6 serves to cope also with an equipment having a power supply plug with two pins ("2P"), such as notebook type personal computer. More specifically, the equipment is used in a state where the 2P plug is inserted into the plug socket unit 5 and where the ground of the equipment is separately connected with the auxiliary ground terminal 6.

Figure 3:
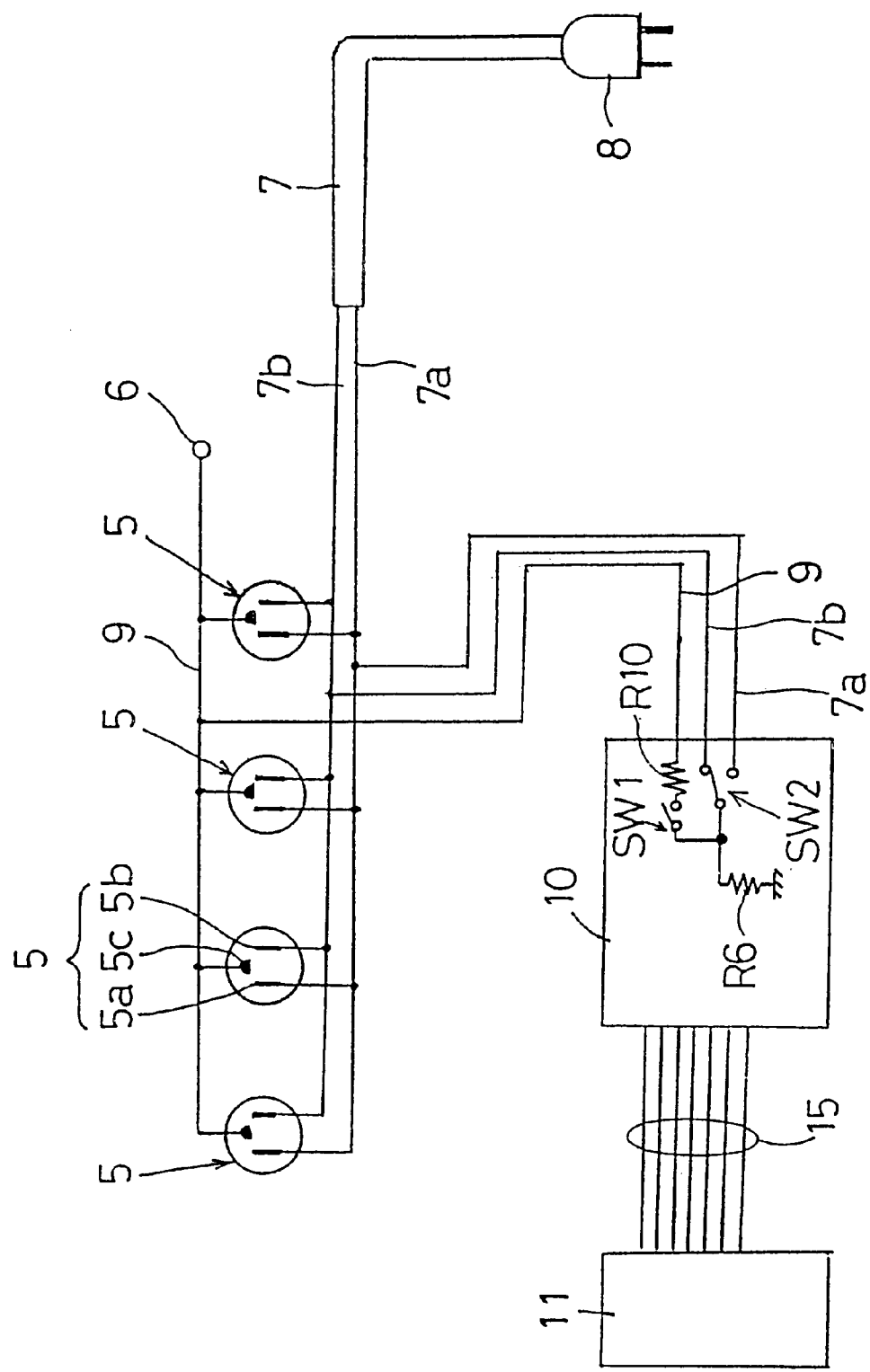
FIG. 3 is a schematic diagram of the circuit arrangement of the detection apparatus.

Further, a power supply cable 7 is extended from the back side 2b of the housing 2. As shown in FIG. 3, a 2P power supply plug (power supply terminal means) 8 is provided at the distal end of the cable 7.

The two AC lines (first AC line 7a, second AC line 7b) of the cable 7 connected to the power supply plug 8 are respectively connected to the AC terminals (first AC terminal 5a, second AC terminal 5b) of each of the plug socket units 5, 5, 5, 5. A wiring structure which covers the power supply plug 8, power supply cable 7 and plug socket units 5, 5, 5, 5 in this manner can be the same as that of an ordinary mobile plug socket (table tap, or extension cable).

Incidentally, the auxiliary ground terminal 6 is connected with the ground terminals 5c of all the plug socket units 5, 5, 5, 5 by a ground line 9.

Figure 4:
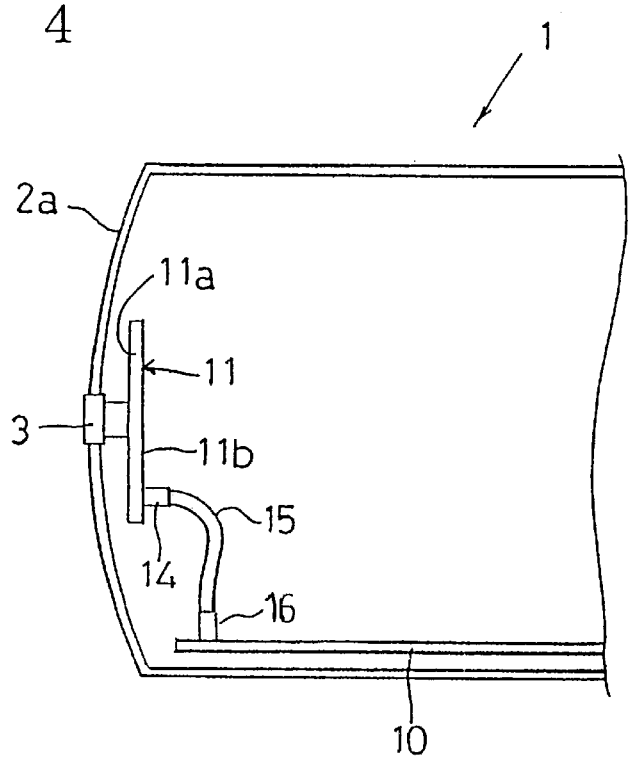
FIG. 4 is a sectional side view of the front side of the detection apparatus.

FIG. 4 illustrates a sectional view of that part of the detection apparatus 1 which is near the front side thereof (with the back side thereof broken away). As shown in FIG. 4, a main circuit board 10 and a switching circuit board 11 are disposed inside the housing 2.

Figure 5:
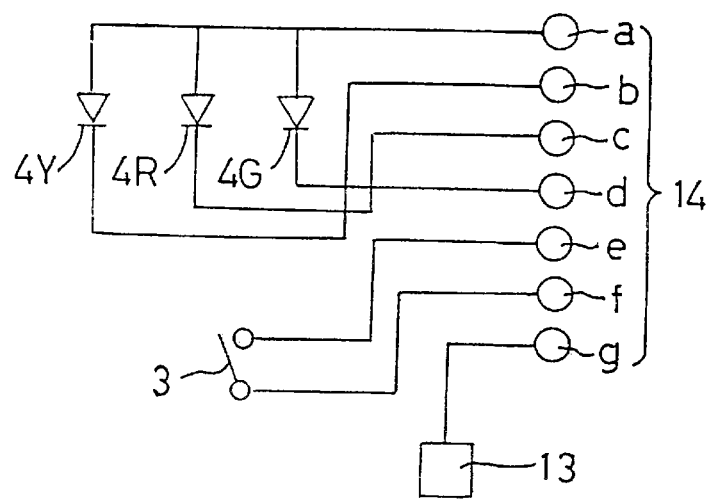
FIG. 5 is a circuit diagram of a switching circuit board.

The switching circuit board 11 is formed with circuits which are shown in FIG. 5. More specifically, the circuits are the detection starting switch 3, the detected-result display unit (LEDs) 4G, 4R, 4Y, an antenna unit 13 for detecting an electromagnetic wave leaking out of the electric equipment, and terminals 14 for connecting the switching circuit board 11 with the main circuit board 10.

The switch 3 and the display unit 4 of LEDs 4G, 4R, 4Y are mounted on the front surface 11a of the circuit board 11, and are arranged so as to be exposed outside the front side 2a of the housing 2 (refer to FIG. 4).

The antenna unit 13 is provided behind the switch 3 and is therefore located in the vicinity of the switch 3, so that it can reliably detect the electromagnetic wave. More specifically, when the user of the detection apparatus 1 manipulates (or pushes) the switch 3 by hand, the hand touches the switch 3 and comes very close to the antenna unit 13. When the person approaches the antenna unit 13, his/her body serves as a medium owing to which the antenna unit 13 can easily detect the electromagnetic wave.

Figure 6:
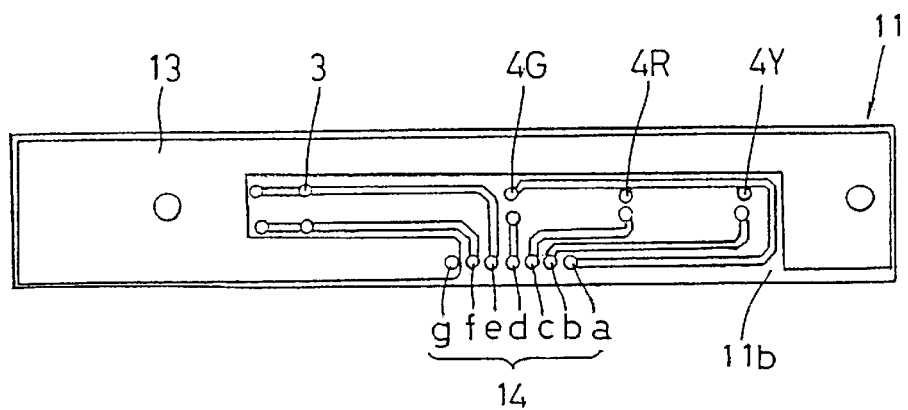
FIG. 6 is a rear view of the switching circuit board.

As illustrated in FIG. 6, wiring lines for interconnecting the switch 3, the display unit (LEDs) 4G, 4R, 4Y and the terminals 14 (a~f) are laid on the rear surface 11b of the circuit board 11, and a conductor panel (antenna element) constituting the antenna unit 13 is formed around the wiring lines. The antenna unit 13 occupies the greater part of the rear board surface 11b as shown in the figure.

Figure 7:
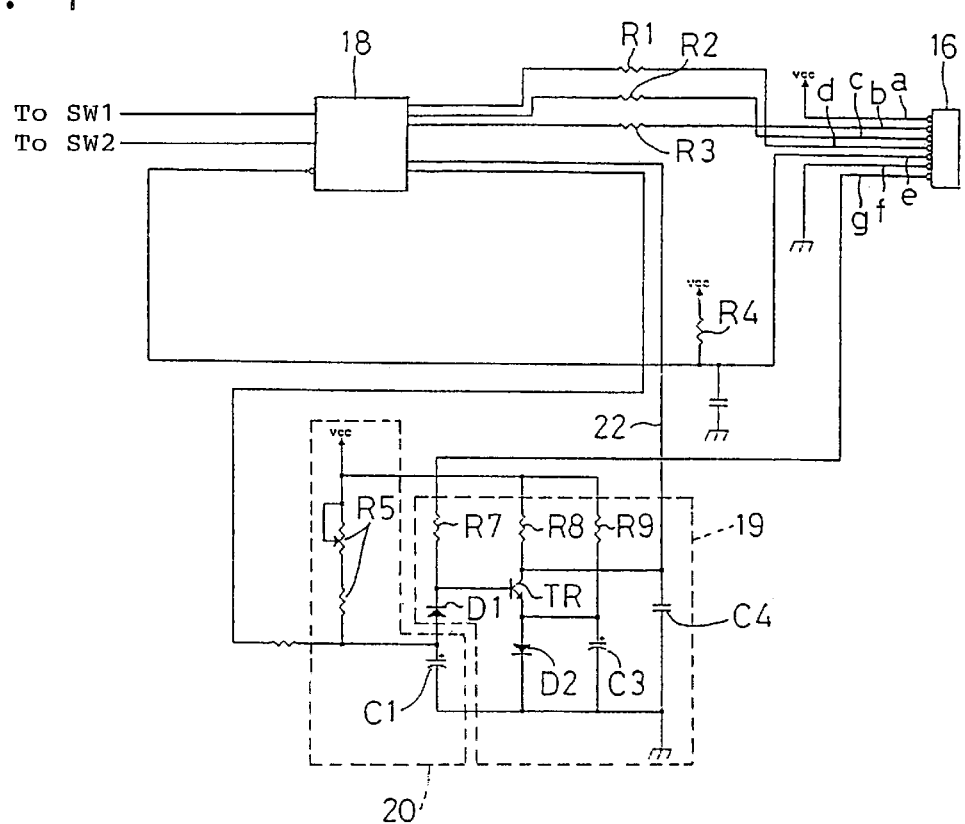
FIG. 7 is a diagram showing some of circuits formed on a main circuit board.

The switch 3, the display unit 4 and the antenna unit 13 are connected from the terminals 14 (a~g) to the terminals 16 of the main circuit board 10 through a cable 15 (refer also to FIGS. 3, 4 and 7).

Figure 8:
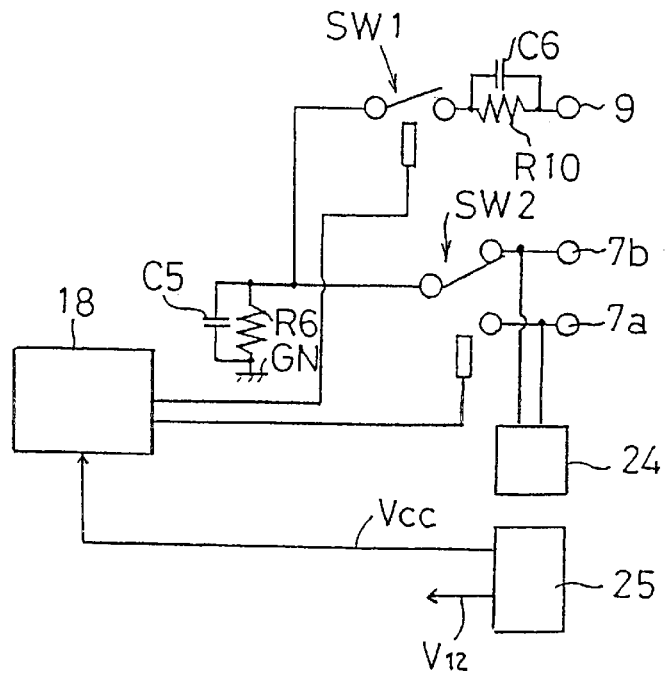
FIG. 8 is a diagram showing some others of the circuits formed on the main circuit board.

FIGS. 7 and 8 illustrate circuits formed on the main circuit board 10. As shown in FIG. 7, the display unit 4 and the switch 3 which are mounted on the switching circuit board 11 are connected to a control unit 18 (symbols a~g in FIG. 5 correspond to ones a~g in FIG. 7, respectively). More specifically, the wiring line a is connected to a supply voltage Vcc, the wiring line b (LED 4Y) is connected to the control unit 18 through a resistor R3, the wiring line c (LED 4R) is connected to the control unit 18 through a resistor R2, the wiring line d (LED 4G) is connected to the control unit 18 through a resistor R1, the wiring line e (switch 3) is connected to the control unit 18, and the wiring line f is connected to the ground. Incidentally, the wiring line e is also connected to the supply voltage Vcc through a resistor R4 in order to feed the control unit 18 with a "High" signal during the turn-OFF of the switch 3 and with a "Low" signal during the turn-ON thereof.

Figure 9:
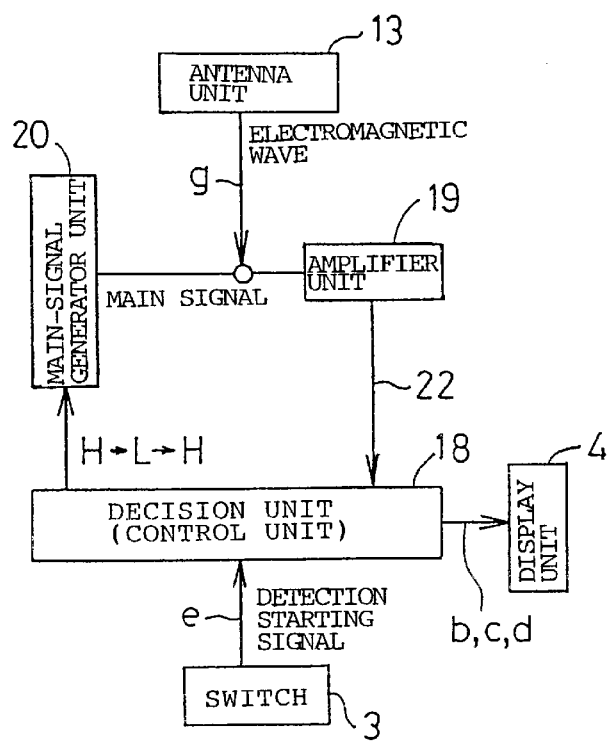
FIG. 9 is a block diagram showing a circuit arrangement for detecting electromagnetic waves.

By the way, a circuit block diagram corresponding to the circuits in FIG. 7 is illustrated in FIG. 9, and the ensuing description will be readily understood by referring to FIG. 9 in addition to FIG. 7.

The antenna unit 13 (wiring line g) is connected to the input side of an amplifier unit 19. Further, a main-signal generator unit 20 is connected to the input side of the amplifier unit 19. Fed to the input node of the amplifier unit 19 is a signal in which an electromagnetic wave signal detected by the antenna unit 13 is superposed on a main signal M generated by the main-signal generator unit 20. A signal amplified by the amplifier unit 19 is fed to the control unit (decision unit) 18 through an amplified-signal output line 22.

The main-signal generator unit 20 serves to produce the signal which is not affected by noise from the AC power supply, for the purpose of discriminating the level of the electromagnetic wave from the electric equipment. Here, since the supply voltage Vcc is produced by stepping down and rectifying the voltage of the AC power supply, it is susceptible to the noise, and it is improper as a reference potential for the discrimination of the electromagnetic wave level in point of incurring malfunctions. In obtaining the signal which is not affected by the noise, the detection apparatus 1 may be furnished with, for example, an independent power supply (such as dry cell) separate from the AC power supply, thereby to produce the main signal from the supply voltage of the power supply. Here in this embodiment, however, a voltage charged in a capacitor is utilized in order to simplify the detection apparatus 1.

More specifically, the main-signal generator unit 20 is configured of a resistor R5 and the capacitor C1 which are connected in series between the supply voltage Vcc and the ground of the detection apparatus 1. The main signal is the voltage (4.2 [V]) charged in the capacitor C1.

The amplifier unit 19 amplifies the input signal by means of a transistor TR. It includes diodes D1, D2, capacitors C3, C4, and resistors R7, R8, R9 in addition to the transistor TR.

FIG. 8 chiefly illustrates the circuits for connecting the two AC lines 7a, 7b on the side of the 2P power-supply plug 8 to the ground GN of the detection apparatus 1 alternately, respectively.

The AC lines 7a, 7b and the ground GN of the detection apparatus 1 are connected through a second switching unit SW2 and a resistor R6, and the AC lines 7a, 7b are alternately connected to the ground GN by changing-over the second switching unit SW2. Normally, the second switching unit Sw2 is held in connection with the side of the second AC line 7b.

Also, a first switching unit SW1 is provided for connecting the second AC line 7b to the ground line 9 through a resistor R10. Normally, the first switching unit SW1 is held in an OFF state.

By the way, a capacitor C5 and a capacitor C6 are respectively connected in parallel with the resistor R6 and the resistor R10.

Besides, the first and second switching units SW1, SW2 are both constructed of relay switches, and the ON-OFF/changeover controls thereof are performed by the control unit 18.

Incidentally, a power circuit 25 is connected to the AC lines 7a, 7b through a transformer 24. The power circuit 25 generates from an AC supply voltage of 100 [V], the DC voltage Vcc of 5 [V] for operating the control unit 18 etc. and a DC voltage V12 of 12 [V] for operating the relay switches SW1, SW2.

Now, the usage and operation of the detection apparatus 1 will be described.

First, the power supply plug 8 is connected to the AC power supply (a plug socket existing in a household, an office or the like), and the 3P plug of the electronic equipment is inserted into the plug socket unit 5, thereby to bring the electronic equipment into an operating state.

Subsequently, when the user pushes the detection starting switch 3, the detection apparatus 1 performs the detecting operation to display the result of the detection on the display unit 4.

The detected results are assorted into the following three cases: (1) In the connected state of the detection apparatus 1, electronic equipment and AC power supply, the ground line 9 is connected to the earthed side (neutral side) of the AC power supply. (2) In the connected state, the ground line 9 is connected to the non-earthed side (hot side) of the AC power supply. (3) The detection apparatus 1 is incapable of the detection. The result (1) corresponds to the case where the leakage of the unfavorable electromagnetic wave was not detected, and the result (2) corresponds to the case where the leakage of the unfavorable electromagnetic wave was detected. The green LED 4G is lit up in the case of the detected result (1), while the red LED 4R is lit up in the case of the detected result (2). The yellow LED 4Y is lit up in the case of the detected result (3).

Upon confirming the detected result, the user may use the electronic equipment with the connected state left intact, in the case of the result (1), and he/she may reverse the poles of the power supply plug 8 and insert this plug 8 again and then use the electronic equipment, in the case of the result (2). In the case of the result (3), the user may push the detection starting switch 3 once more so as to perform the detecting operation.

Next, the steps of the detecting operation will be described in detail. First, when the detection starting switch 3 is pushed (or when it turns ON), a detection starting signal (resetting signal) is fed to the control unit 18, and this control unit 18 is reset (that is, the switch 3 is a resetting switch). Further, the control unit 18 feeds the "Low" signal to the capacitor C1 of the main-signal generator unit 20. Thus, charges stored in the capacitor C1 (normally charged) are discharged until the potential of this capacitor C1 is lowered down to 0 [V]. Thereafter, when the switch 3 turns OFF, the control unit 18 feeds the "High" signal to the capacitor C1 so as to charge up this capacitor C1 again and to generate the main signal M of 4.2 [V].

Figure 10:
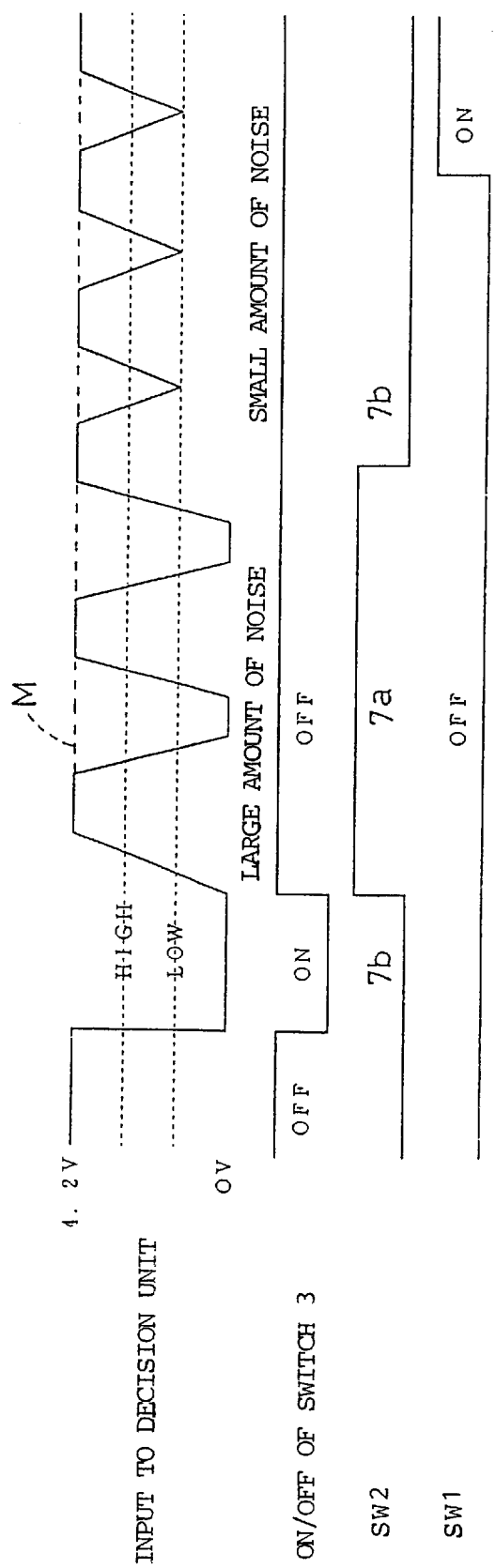
FIG. 10 is a waveform diagram showing the operation of the detection apparatus.

The electromagnetic wave (noise) detected by the antenna unit 13 with the medium of the detection being the body of the user who touched the switch 3, is superposed on the main signal M (refer to the waveform of the input to the decision unit 18 as shown in FIG. 10).

The changeover of the second switching unit SW2 is started simultaneously with the generation of the main signal M. As shown in FIG. 10, the magnitude of the electromagnetic wave detected by the antenna unit 13 differs depending upon which of the AC lines 7a, 7b the second switching unit SW2 is connected to.

More specifically, the detected electromagnetic wave (noise) is of small magnitude in a case where the second switching unit SW2 is connected to the earthed side one of the AC lines 7a, 7b, and it is of large magnitude in a case where the second switching unit SW2 is connected to the non-earthed side one of the AC lines 7a, 7b.

It is accordingly understood by changing-over the second switching unit SW2 that the connected state exhibiting a lower level of detected electromagnetic wave is an earthed state, whereas the connected state exhibiting a higher level of detected electromagnetic wave is a non-earthed state. This is the basic principle of the earthed-side detection according to the present invention.

When the electromagnetic wave is superposed on the main signal M, the resulting signal becomes a ripple signal due to the electromagnetic wave noise. As the pulsation of the ripple signal is larger, the noise is of larger magnitude. It is seen in the example shown in FIG. 10 that, while the second switching unit SW2 is held connected to the first AC line 7a, the pulsation of the input signal to the control unit 18 serving as the decision unit is large, so the electromagnetic wave level is high. It is also seen that, while the second switching unit SW2 is held connected to the second AC line 7b, the pulsation is comparatively small, so the electromagnetic wave level is low.

The decision unit 18 can detect the discrepancy of the noise levels so as to discriminate that one of the AC lines 7a, 7b that exhibits the little noise is on the earthed side, whereas the other of the AC lines 7a, 7b that exhibits the greater noise is on the non-earthed side. Described thus far is the discrimination processing.

By the way, the discrimination unit 18 in this embodiment is operated in accordance with TTL levels (the "Low" signal is outputted for the input signal of below 1.2 [V], the "High" signal is outputted for the input signal of above 2.5 [V], and the output signal becomes unsettled for the input signal of 1.2 [V] thru 2.5 [V] inclusive). In the case of the greater noise, the ripple signal becomes below 1.2 [V], and the "Low" level is detected. On the other hand, in the case of the little noise, the ripple signal does not become below 1.2 [V], and the "High" level is eventually detected. Accordingly, the discrepancy of the noise can be discriminated.

Herein, if the AC line discriminated as the earthed side is the second AC line 7b, the leakage of the electromagnetic wave is little even when the electric or electronic equipment is used in the connected state as it is, for the reason that the second AC line 7b is normally connected by the second switching unit SW2. Accordingly, it can be said that the connected state is a "good connected state" That is, this state corresponds to the detected result (1) explained before. In this case, the discrimination unit 18 turns ON the first switching unit SW1 to connect the second AC line 7b and the ground line 9, and it lights up the green LED 4G.

In contrast, if the AC line discriminated as the earthed side is the first AC line 7a, the unfavorable electromagnetic wave leaks when the electric or electronic equipment is used in the connected state as it is, for the reason that the first AC line 7a is not normally connected by the second switching unit SW2, so the second AC line 7b lying on the non-earthed side is connected with the ground line 9 by the turn-ON of the first switching unit SW1. Accordingly, it can be said that the connected state is a "bad connected state". That is, this state corresponds to the detected result (2) explained before. In this case, the discrimination unit 18 lights up the red LED 4R without turning ON the first switching unit SW1.

Besides, in a case where the discrimination unit 18 has failed to discriminate the earthed side successfully due to the noise level or the like, it lights up the yellow LED 4Y to indicate the foregoing detected result (3).

In the example of FIG. 10, the side of the second AC line 7b exhibits the little noise and is discriminated as the earthed side, so that the switching unit SW1 is turned ON and that the green LED 4G is lit up.

By the way, in the case where the first AC line 7a has been discriminated as the earthed side, the second switching unit SW2 may well be kept connected to the side of the first AC line 7a by the control unit 18. With this contrivance, however the power supply plug 8 may be connected to the AC power supply, the line detected as the earthed side can be connected to the ground line 9, and the detection apparatus 1 can be used as an automatic earthing apparatus.

Figure 11:
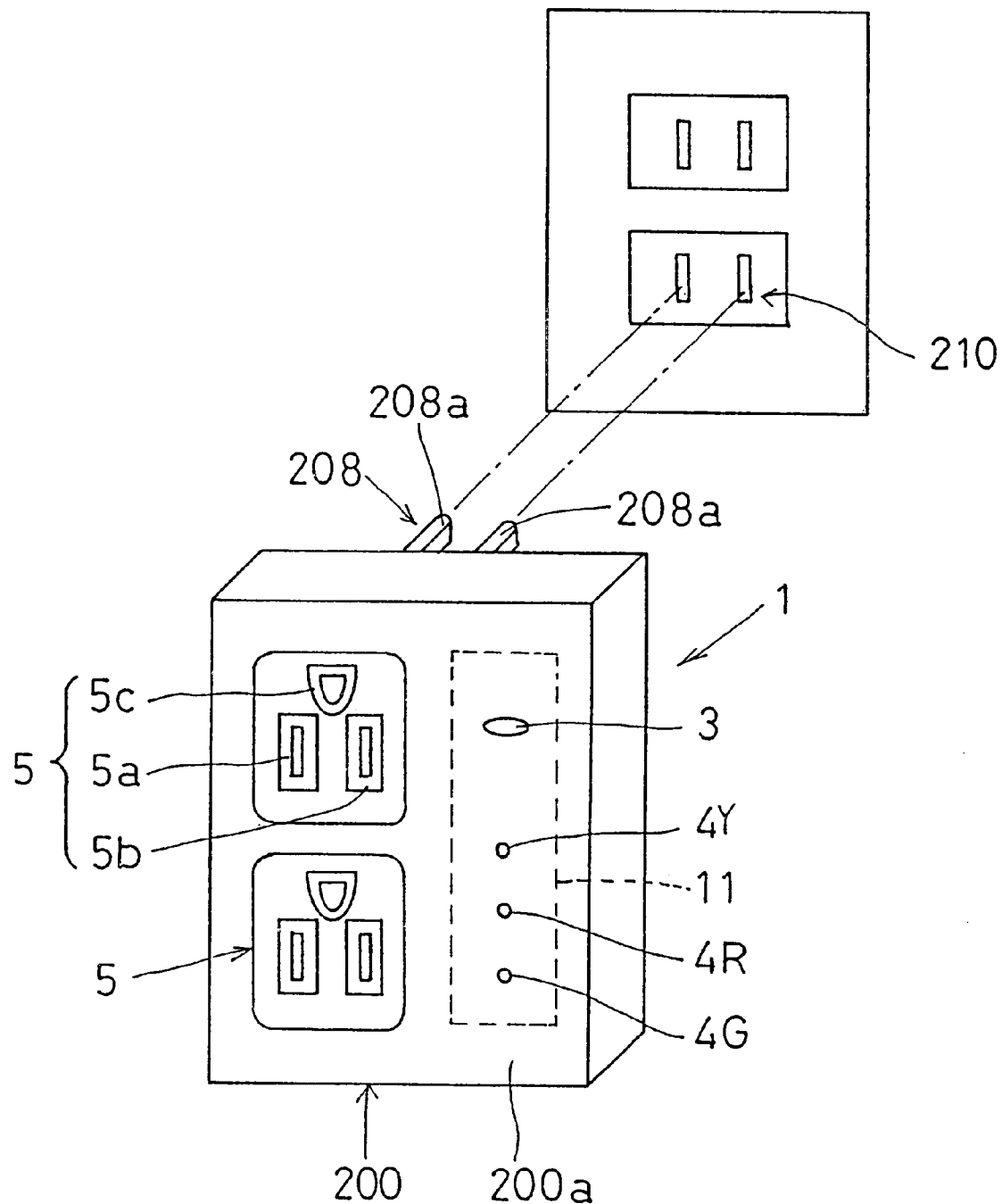
FIG. 11 is a perspective view showing a detection apparatus according to the second embodiment of the present invention for detecting the earthed side of an AC power supply.

FIG. 11 illustrates a detection apparatus 1 according to the second embodiment of the present invention. Unlike the first embodiment, the detection apparatus 1 is not provided with the power supply cable 7. Instead, two power supply pins 208a are protruded from the back side of a housing 200, and they constitute a plug 208 which can be inserted into a plug socket 210 mounted in the wall or the like of a house or a building. Besides, in the second embodiment, the plug socket units 5, 5, switch 3 and LEDs 4 of the detection apparatus 1 are collectively arranged on the front side 200a of the housing 200.

Accordingly, the detection apparatus 1 of this embodiment can be used just as a distributing plug socket of the type which can be directly inserted into the plug socket 210.

Also in this embodiment, a switching circuit board 11 is disposed behind the switch 3. Besides, points omitted from description are the same as in the first embodiment.

Figure 12:
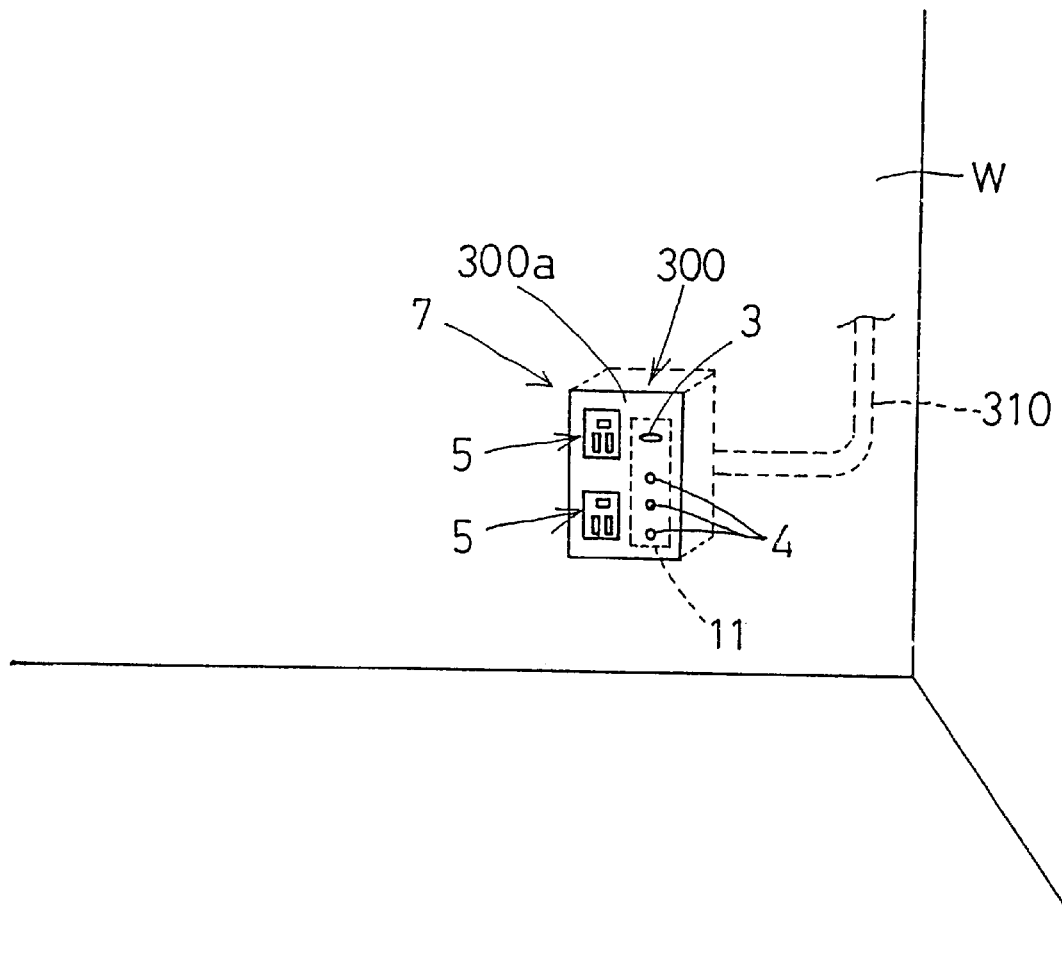
FIG. 12 is a perspective view showing a detection apparatus according to the third embodiment of the present invention for detecting the earthed side of an AC power supply.

FIG. 12 illustrates a detection apparatus 1 according to the third embodiment of the present invention. The detection apparatus 1 is buried in the wall or the like of a house, a building or the like, and can be used just as an ordinary plug socket. More specifically, the plug socket units 5, 5, switch 3 and LEDs 4 of the detection apparatus 1 are arranged on the front side 300a of a housing 300, and the detection apparatus 1 is mounted so that the front side 300a may be exposed out of the wall W. Incidentally, the housing 300 suffices with the front part exposed out of the wall, and it need not cover the whole detection apparatus 1 including the circuit boards thereof. Besides, the power supply terminals of the detection apparatus 1 are connected with the wiring lines 310 of the AC power supply of the building or the like at the time of, for example, the wiring work of the building or the like. Besides, points omitted from the description of this embodiment are the same as in the first and second embodiments.

The present invention is not restricted to the foregoing embodiments. By way of example, the decision unit need not always discriminate the electromagnetic wave noise in accordance with the TTL levels, but it may well be so constructed that the main signal on which the electromagnetic wave signal is superposed is compared with a minus reference voltage by a comparator.

Although, in the foregoing embodiments, the antenna unit 13 is constructed of the antenna element which is provided on the rear surface of the switching circuit board 11, the circuits themselves can pick up the noise without such an independent antenna element. Therefore, the separate provision of the antenna element is not indispensable in the present invention, but the antenna element can be omitted in the case where the circuits themselves fulfill the function of the antenna unit. The reason therefor is that the circuit wiring lines themselves have the function of the antenna unit picking up the noise. Incidentally, the separate provision of the antenna element is more preferable because the precision of the detection is enhanced.

Besides, at least one plug socket unit 5 may be provided, but the plurality of plug socket units 5, 5 are more preferable.

Apart from the purpose of preventing the leakage of the electromagnetic wave, the detection apparatus 1 can be used for preventing an electric shock on the basis of the earthing. Also, it serves to ensure the stable operation of the electric or electronic equipment based on being earthed.

Further, the detection apparatus 1 can be extensively utilized as the power-supply plug socket for various equipment which cover, not only the computer, but also a video equipment such as television receiver or video tape recorder, an audio equipment such as audio system, a medical equipment of which a stable operation is required, and so forth.

What is claimed is:

1. A detection apparatus for detecting a line on an earthed side of an AC power supply including two AC power lines, comprising:

power supply terminals configured to be connected to the AC power supply;

ground terminals configured to be connected to ground of an electric or electronic equipment;

a switching unit configured to selectively connect a first of the two AC lines of the AC power supply to ground of the detection apparatus, the selective connection being changed-over to connect a second of the two AC lines to the ground of the detection apparatus;

an antenna unit configured to detect an electromagnetic wave leaking out of the electric or electronic equipment; and a discrimination unit configured to discriminate an earthed side and a non-earthed side of the two AC lines based on a level of the electromagnetic wave and that depends on which of the two AC lines is connected to the ground of the detection apparatus.

2. A detection apparatus according to claim 1, further comprising a main signal unit generator configured to generate a main signal, and wherein said discrimination unit is fed with a signal in which the electromagnetic wave signal detected by said antenna unit is superposed on the main signal.

3. A detection apparatus according to claim 1, further comprising a housing inside which, at least, the discrimination unit is included;

said housing being provided with the switch of the detection apparatus;

said antenna unit being arranged in the vicinity of said switch.

4. A detection apparatus according to claim 3, wherein said antenna unit is disposed inside said housing and behind said switch.

5. A detection apparatus according to claim 3, wherein said switch is mounted on a circuit board disposed inside said housing, so as to be manipulatable from outside said housing, and said antenna unit is formed on said circuit board.

6. A detection apparatus according to claim 3, wherein said switch is a detection starting switch which commands said discrimination unit to start the detection.

7. A detection apparatus according to claim 6, wherein the main signal is generated by manipulation of said detection starting switch.

8. A detection apparatus according to claim 1, wherein said power supply terminals comprise a plug of two pins into which can be inserted a plug socket connected to the AC power supply.

9. A detection apparatus according to claim 1, further comprising a housing which includes a plug socket unit into which a power supply plug of the electric or electronic equipment can be inserted.

10. A detection apparatus according to claim 9, wherein said housing is attached to a building or a house, and said power supply terminals are connected to AC-power-supply wiring lines which are laid in the building or the house.

11. A detection apparatus for detecting a line on an earthed side of an AC power supply including two AC power lines, comprising:

power supply terminal means for connecting to the AC power supply;

ground terminals for connecting to ground of an electric or electronic equipment;

switching means for selectively connecting a first of the two AC lines of the AC power supply to ground of the detection apparatus, and for selectively changing-over the connection to connect a second of the two AC lines to the ground of the detection apparatus;

antenna means for detecting an electromagnetic wave leaking out of the electric or electronic equipment; and discrimination means for discriminating an earthed side and a non-earthed side of the two AC lines based on a level of the electromagnetic wave and that depends on which of the two AC lines is connected to the ground of the detection apparatus.

12. A detection apparatus according to claim 11, further comprising main signal generating means for generating a main signal, and wherein said discrimination means is fed with a signal in which the electromagnetic wave signal detected by said antenna means is superposed on the main signal.

13. A detection apparatus according to claim 11, further comprising housing means inside which, at least, the discrimination means is included;

said housing means being provided with the switch of the detection apparatus;

said antenna means being arranged in the vicinity of said switch.

14. A detection apparatus according to claim 13, wherein said antenna means is disposed inside said housing means and behind said switch.

15. A detection apparatus according to claim 13, wherein said switch is mounted on a circuit board disposed inside said housing means, so as to be manipulatable from outside said housing means, and said antenna means is formed on said circuit board.

16. A detection apparatus according to claim 13, wherein said switch is a detection starting switch which commands said discrimination means to start the detection.

17. A detection apparatus according to claim 12, wherein the main signal is generated by manipulation of a detection starting switch.

18. A detection apparatus according to claim 11, wherein said power supply terminal means comprise a plug of two pins into which can be inserted a plug socket.

19. A detection apparatus according to claim 11, further comprising housing means which includes a plug socket unit into a power supply plug of the electric or electronic equipment can be inserted.

20. A detection apparatus according to claim 19, wherein said housing means is attached to a building or a house, and said power supply terminal means is connected to AC-power-supply wiring lines which are laid in the building or the house.

* * * * *